(12) United States Patent
Otomo et al.

(10) Patent No.: US 7,368,954 B2
(45) Date of Patent: May 6, 2008

(54) PHASE COMPARISON CIRCUIT AND CDR CIRCUIT

(75) Inventors: Yusuke Otomo, Kanagawa (JP); Masafumi Nogawa, Kanagawa (JP)

(73) Assignee: Nippon Telegraph and Telephone Corporation (JP)

( * ) Notice: Subject to any disclaimer, the term of this patent is extended or adjusted under 35 U.S.C. 154(b) by 7 days.

(21) Appl. No.: 10/535,273

(22) PCT Filed: Mar. 4, 2004

(86) PCT No.: PCT/JP2004/002714

§ 371 (c)(1),
(2), (4) Date: May 17, 2005

(87) PCT Pub. No.: WO2004/079907

PCT Pub. Date: Sep. 16, 2004

(65) Prior Publication Data

US 2006/0050828 A1    Mar. 9, 2006

(30) Foreign Application Priority Data

Mar. 4, 2003 (JP) ............................. 2003-057261
Mar. 18, 2003 (JP) ............................. 2003-073720

(51) Int. Cl.
    *H03D 13/00* (2006.01)
(52) U.S. Cl. .................................... 327/3; 327/156
(58) Field of Classification Search ............. None
    See application file for complete search history.

(56) References Cited

U.S. PATENT DOCUMENTS 5,220,275 A * 6/1993 Holmqvist ............... 324/76.82
5,359,298 A * 10/1994 Abe ............................ 331/2
5,428,648 A * 6/1995 Fukuda ....................... 375/371
6,225,831 B1 5/2001 Dalmia et al.
6,421,404 B1 7/2002 Nakamura (Continued)

FOREIGN PATENT DOCUMENTS

GB    2089601 A  *  6/1992

(Continued)

OTHER PUBLICATIONS

Nakamura, Kazuyuki; Fukaishi, Muneo; Abiko, Hitoshi; Matsumoto, Akira and Yotsuyanagi, Michio, A 6 Gbps CMOS Phase Detecting Demux Module Using Half-Frequency Clock, IEEE, 1998.

(Continued)

*Primary Examiner*—Quan Tra
*Assistant Examiner*—Khareem E. Almo
(74) *Attorney, Agent, or Firm*—Fitch, Even, Tabin & Flannery (57) ABSTRACT

Providing a CDR circuit having a stable clock extracting function and a data regenerating function with a high-speed data input process by reducing the operation speed of the phase comparator circuit. With a phase comparator circuit capable of operating with a clock signal whose period is 2 times the unit time width of the inputted data signal, the pulse width of the phase error signal, representing the difference in phase between the transition point of the data signal and the transition point of the clock signal, is extended as much as the unit time width of the data signal.

2 Claims, 9 Drawing Sheets

U.S. PATENT DOCUMENTS

| | | | |
|---|---|---|---|
| 6,771,728 B1 * | 8/2004 | Abernathy | .................. 375/371 |
| 2003/0142774 A1 | 7/2003 | Takasoh et al. | |

FOREIGN PATENT DOCUMENTS

| JP | 11-112335 A | 4/1999 |
|---|---|---|
| JP | 11-355133 A | 12/1999 |
| JP | 2000077990 | 3/2000 |
| JP | 2001144592 | 5/2001 |
| JP | 2001-196907 A | 7/2001 |
| JP | 2002171160 | 6/2002 |
| JP | 2002-314387 A | 10/2005 |

OTHER PUBLICATIONS

Savoj, Jafar and Razavi, Behzad, A 10-Gb/s CMOS Clock and Data Recovrey Circuit with a Half-Rate Linear Phase Detector, IEEE Journal of Solid-State Circuits, vol. 36, No. 5, May 2001, pp. 761-768.

Ohtomo, Yusuke; Kawamura, Tomoaki; Nishimura, Kazuyoshi, Nogawa, Masafumi; Koizumi;Hiroshi, and Togashi, Minouru, A 12.5 Gb/s CMOS BER Test Using a Jitter-Tolerant Parallel CDR, IEEE International Solid-State Circuits Conference, ISSCC Digest of Technical Papers, Feb. 2004, pp. 174-175.

* cited by examiner

FIG.2 HOLMQVIST AND SUMMERS

| SIGNAL NAME | LOGICAL EXPRESSION | SIGNAL SPEED |
|---|---|---|
| (Input Signal) DP | | |
| (Reference Clock) CK | CK | f/2 |
| | CKN | f/2 |
| D-F/F (31 701 D1) | ↑ CK | f/2 |
| D-F/F (32 703 D3) | ↑ CKN | |
| D-F/F (33 702 D2) | ↑ CKN | |
| D-F/F (34 703 D4) | ↑ CK | |
| EOR (35 705) | D2 xor D3 | |
| EOR (36 706) | D1 xor D4 | |

FIG.3 THE PRESENT INVENTION

FIG.4 HOLMQVIST AND SUMMERS

| SIGNAL NAME | LOGICAL EXPRESSION | SIGNAL SPEED | Waveform / Values |
|---|---|---|---|
| Input Signal DP | | f/2 | 0 1 2 3 4 5 6 7 8 9 (T/4 GAIN) |
| Reference Clock CK | CK | f | (clock waveform) |
| | CKN | f | (clock waveform) |
| D-F/F (31 701 D1) | ↑ CK | | 0 1 2 3 4 5 6 7 8 |
| D-F/F (32 703 D3) | ↑ CKN | | 0 1 2 3 4 5 6 7 |
| D-F/F (33 702 D2) | ↑ CKN | | 0 1 2 3 4 5 6 7 |
| D-F/F (34 703 D4) | ↑ CK | | 0 1 2 3 4 5 6 7 |
| EOR (35 705) | D2 xor D3 | | "L" |
| EOR (36 706) | D1 xor D4 | | 0xor1 1xor2 2xor3 3xor4 4xor5 5xor6 |

FIG.6 HOLMQVIST AND SUMMERS

PHASE COMPARISON CIRCUIT AND CDR CIRCUIT

TECHNICAL FIELD

Present invention relates to a phase comparator circuit designed for outputting the phase error signal having the pulse width corresponding to the phase difference between the data signal and the clock signal and a CDR circuit designed for regenerating the data signal by phasing the clock signal with the data signal.

BACKGROUND ART

Conventionally, there have been known a variety of signal regenerating circuit systems designed for regenerating the signal received by the receiving apparatus constituting the optical communication system. The CDR (Clock and Data Recovery Circuit) is a circuit system designed to extract the clock signal from the received data signal so that the phase comparator circuit carries out phase synchronization between the clock signal and the data signal, thereby regenerate the data signal. On the other hand, the PLL (Phase Locked Loop) circuit is a circuit system designed to synchronize the clock signal from the voltage-controlled oscillator with the external clock signal by using the phase-frequency comparator circuit. The PLL circuit and the CDR circuit differ from each other in that the former is designed to compare the frequencies of the clock signals, and the latter is designed to compare the phase of the random data signal with the phase of the clock signal.

The phase comparator circuit constituting the CDR circuit is designed to represent the phase difference between the inputted data signal Din and the extracted clock signal CK in terms of the pulse width difference between the phase error signal Error and the reference signal Ref. As an example of the conventional phase comparator circuit a half-rate type linear phase comparator circuit has been disclosed by Jafar Savoj and Behzad Razavi as "A 10-Gb/s CMOS Clock and Data Recovery Circuit with a Half-Rate Linear Phase Detector", IEEE Journal of Solid-state Circuits, vol. 36, No. 5, pp. 761-769, May 2001.

Figure 1:
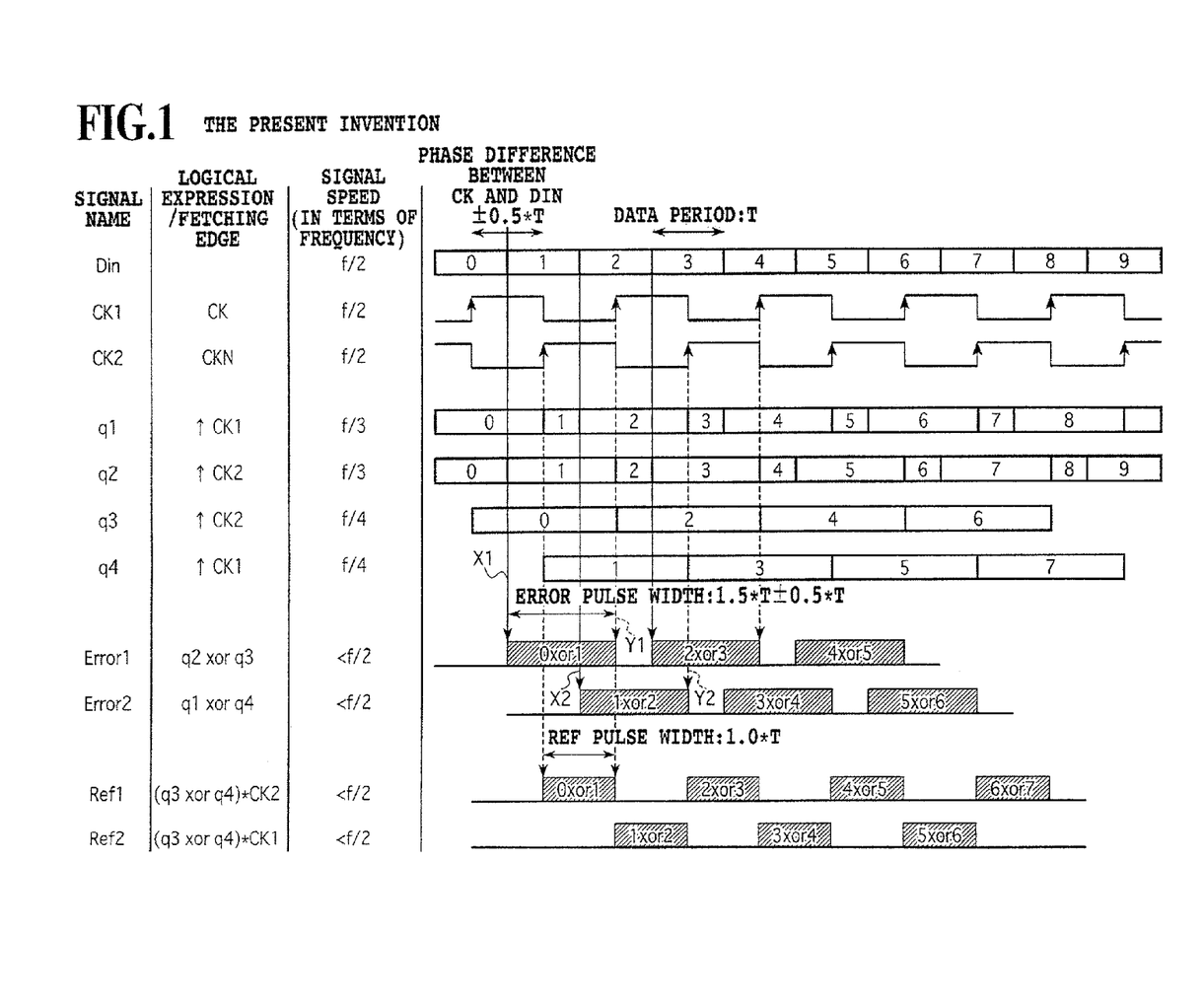
FIG. 1 is a circuit diagram of a conventional phase comparator circuit.

FIG. 1 shows a conventional phase comparator circuit. In this circuit, the data signal Din is latched with 2 latch circuits, L1 and L2. The latch circuit L1 latches the data signal Din at the rising edge of the clock signal CK, and the latch circuit L2 latches the data signal Din at the falling edge of the clock signal CK. The exclusive OR circuit El outputs the exclusive OR (XOR) of the outputs of the latch circuits L1 and L2 as the phase error signal Error. On the other hand, the outputs Q1 and Q2 are latched respectively with 2 latch circuits L3 and L4. The latch circuit L3 latches the clock signal CK at the falling edge thereof, and the latch circuit L4 latches the clock signal CK at the rising edge thereof. The exclusive OR circuit E2 outputs the XOR of the outputs, Q3 and Q4, of the latch circuits L3 and L4 as the reference signals Ref.

Figure 2:
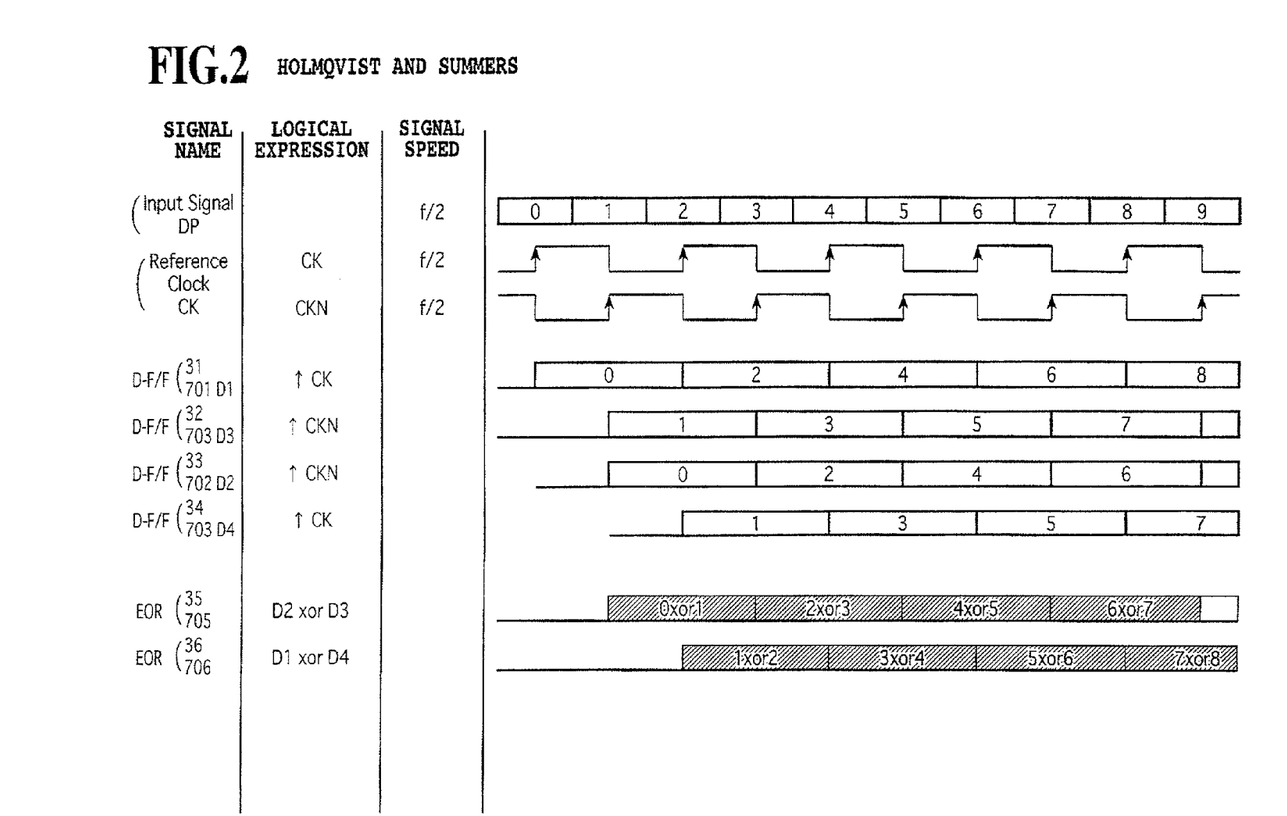
FIG. 2 is a time chart for illustrating the operation of a conventional phase comparator circuit.

FIG. 2 shows the operation of the phase comparator circuit. When there is the transition of the data signal Din, the phase error signal Error has a pulse width corresponding to the time lag between the transition edge of the data signal (represented by X1 in FIG. 2) and the rising edge (represented by Y1 in FIG. 2) of the clock signal CK and the time lag between the transition edge (represented by X2 in FIG. 2) of the data signal and the falling edge of the clock signal CK (represented by Y2 in FIG. 2). When there is the transition of the data signal Din, the reference signal Ref always has the pulse width equivalent to the width ranging from the fall to the rise of the clock signal (equivalent to the data period T). When the rising edge (or the falling edge) of the clock signal CK coincides with the center of the data signal Din to create the desirable phase relationship, the pulse width of the phase error signal Error becomes ½ of the pulse width of the reference signal Ref.

When the rising edge of the clock signal CK coincides with the point preceding by $\Delta t$ (indicated as $\pm 0.5^*T$, the maximum range of $\Delta t$, in FIG. 2) from the center of the data signal Din, the pulse width of the phase error signal Error decreases by $\Delta t$ to ½ of the pulse width of the reference signal. When the rising edge of the clock signal CK coincides with the point after the center of the data signal Din by $\Delta t$, the pulse width of the phase error signal Error increases by $\Delta t$ to ½ of the pulse width of the reference signal Ref.

In the conventional phase comparator circuit, the phase error signal Error, as being the output of the exclusive OR circuit El, is a pulse having the time interval ranging from the transition edge of the data signal Din to the transition edge of the subsequent clock signal CK. Given that the period of the data signal Din is T sec, and the data speed is f/2 Hz (in terms of the clock signal), the pulse width of the phase error signal Error is 0.5* or less. Hence, the operation speed required for the circuit is f Hz or more in terms of the frequency. That is, in order to realize the conventional phase comparator circuit and the CDR circuit incorporating such conventional phase comparator circuit, it is necessary to use the element capable of operating at the speed as fast as 2 times the speed of the input of the data.

DISCLOSURE OF THE INVENTION

An object of the present invention is to provide a CDR circuit capable of providing a stable clock extracting function and the data forming function to cope with the high-speed input of the data by reducing the operation speed of the phase comparator circuit.

The phase comparator circuit relating to an embodiment of the present invention is designed to operate with the clock signal having a period equivalent to 2 times the period of the unit time interval of the inputted data signal. The data signal is inputted to the first latch circuit and the second latch circuit; the first latch circuit performs the latching operation with the first clock signal, and the second latch circuit performs the latching operation with the second clock signal as being the inverted clock of the first clock signal. The output of the first latch circuit is inputted to the third latch circuit; the output of the second latch circuit is inputted to the fourth latch circuit; the third latch circuit performs the latching operation with the second clock signal; the fourth latch circuit performs the latching operation with the first clock signal. The exclusive OR between the output of the second latching circuit and the output of the third latching circuit is used as the first phase error signal, and the exclusive OR between the output of the first latching circuit and the output of the fourth latching circuit is used as the second phase error signal.

In the phase comparator circuit relating to another embodiment, the output of the second latch circuit is inputted to the first delay circuit; the exclusive OR between the output of the first delay circuit and the output of the third latch circuit is used as the first phase error signal; the output of the first latch circuit is inputted to the second delay circuit; the exclusive OR between the output of the second delay circuit and the output of the fourth latch circuit is used as the second phase error signal.

BRIEF DESCRIPTION OF THE DRAWINGS

FIGS. 5A-5C are the diagrams for comparing the pulse width of phase error signal according to the first embodiment with the pulse width of the phase error signal of the conventional phase comparator circuit.

BEST MODE FOR CARRYING OUT THE INVENTION

The modes for carrying out the present invention will be described in detail with reference to the pertinent drawings.

(Phase Comparator Circuit)

Figure 3:
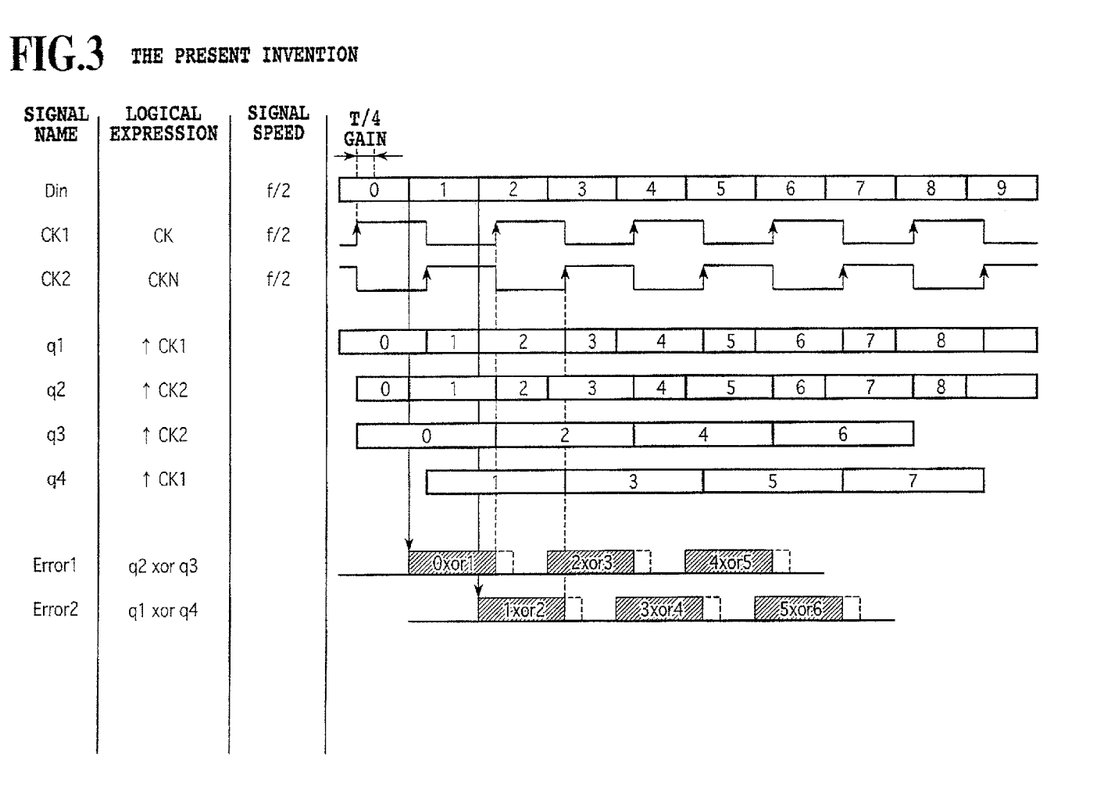
FIG. 3 is the circuit diagram of the phase comparator circuit according to the first embodiment of the present invention.

FIG. 3 shows the phase comparator circuit according to the first embodiment of the present invention. The phase comparator circuit comprises 4 latch circuits, namely L1 (the first latch circuit), L2 (the second latch circuit), L3 (the third latch circuit) and L4 (the fourth latch circuit), 3 exclusive OR circuits, namely E1, E2 and E3, and 2 AND circuits, namely A1 and A2.

The phase comparator circuit according to the first embodiment serves for inputting the data signal Din to the common data terminal D for the latch circuits L1 and L2. The output terminal Q of the latch circuit L1 is connected with the data terminal D of the latch circuit L3 and also with the first input terminal of exclusive OR circuit E2. Output terminal Q of the latch circuit L2 is connected with the data terminal D of the latch circuit L4 and also with the first input terminal of the exclusive OR circuit E1. The output terminal Q of the latch circuit L3 is connected with the second input terminal of the exclusive OR circuit E1 and also with the first input terminal of the exclusive OR circuit E3. The output terminal Q of the latch circuit L4 is connected with the second input terminal of the exclusive OR circuit E2 and also with the second input terminal of the exclusive OR circuit E3. The output of the exclusive OR circuit E1 is the phase error signal Error 1 (the first phase error signal) to the phase comparator circuit. The output of the exclusive OR circuit E2 is the phase error signal Error 2 (the second phase error signal) to the phase comparator circuit.

The output terminal of the exclusive OR circuit E3 is connected commonly with the first input terminal of AND circuit A1 and the first input terminal of AND circuit A2. Clock signal CK1 (the first clock) is inputted to the clock input terminal C of the latch circuit L1, to the clock input terminal C of the latch circuit L4 and to the second input terminal of the AND circuit A2. Further, the clock signal CK2 (the second clock signal), as being the inverted clock of the clock signal CK1, is inputted to the clock input terminal C of the latch circuit L2, to the clock input terminal C of the latch circuit L3 and to the second input terminal of AND circuit A1. The clock signal CK1 and the clock signal CK2 are half-rate clocks whose periods are 2 times the period T of the data signal Din.

Figure 4:
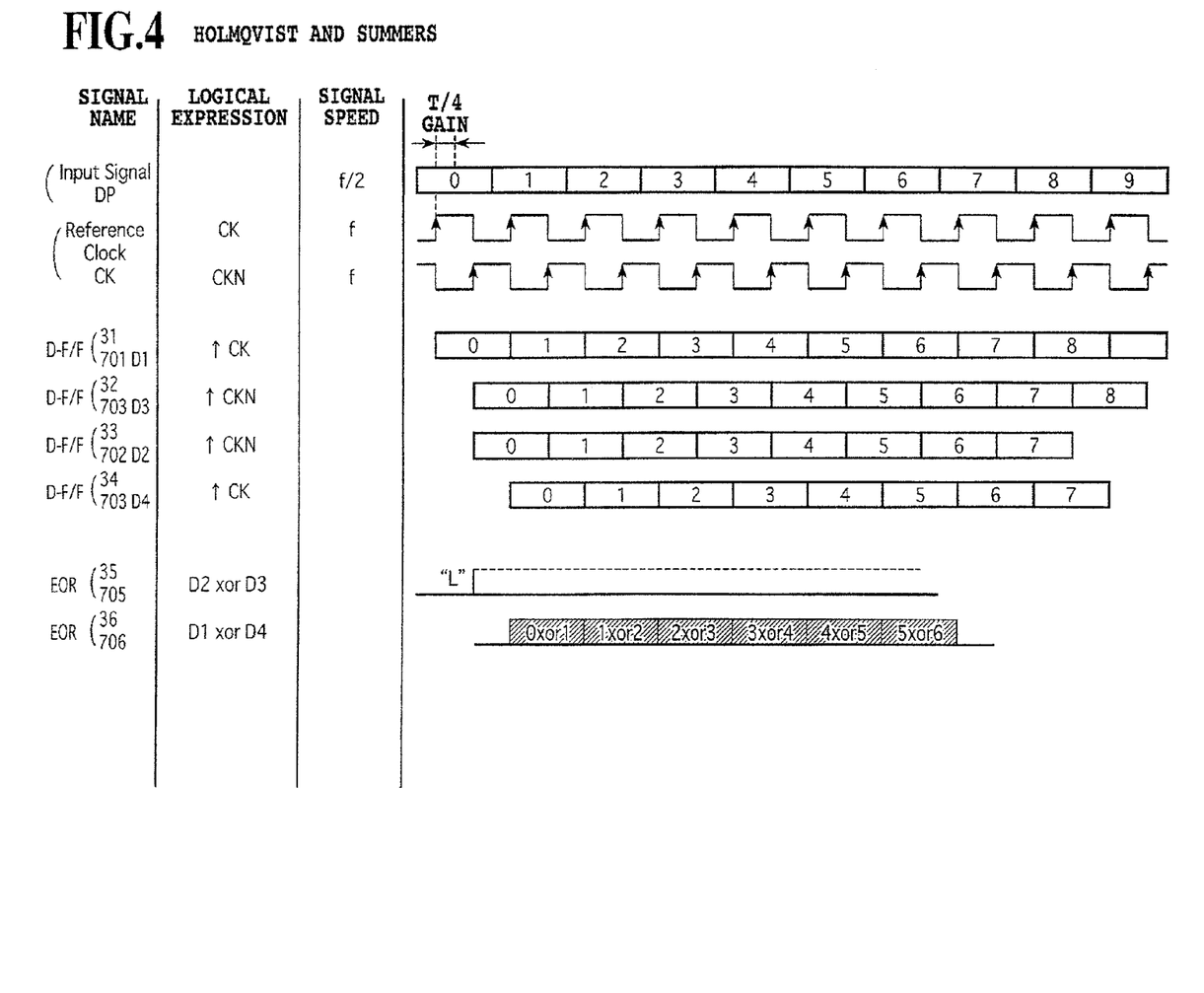
FIG. 4 is the time chart illustrating the operation of the phase comparator circuit according to the first embodiment of the present invention.

Referring to FIG. 4 the operation of the phase comparator circuit according to the first embodiment will be described. The state, wherein the transition edge of the clock signal CK1 and the transition edge of the clock signal CK2 coincide with the center (the central time point of the data signal period T) of the data signal Din, is termed as "the in phase state". The time periods during which the transition edge of the clock signal CK1 and the transition edge of the clock signal CK2 are out of the center of the data signal Din are termed "the phase error". The phase comparator circuit is designed so that the signal can be outputted after undergoing the process wherein the phase error is directly added to or subtracted from the reference width of the phase error signal on the basis of the pulse width, as being the pulse width of the phase error signal at the point where the phases coincide with each other. The phase error signals Error 1 and Error 2, as being the outputs from the exclusive OR circuits E1 and E2, are outputted when the levels of the two consecutive data represented by the data signal Din change from high-level to low-level or vise versa.

Further, the phase comparator operates an output from the AND circuit A1 as the reference signal Ref 1 wherein the output of the exclusive OR circuit and the clock CK2 are inputted to the AND circuit A1, and operates an output from the AND circuit A2 as the Reference signal Ref 2 wherein the output of the exclusive OR circuit E3 and clock CK1 are inputted to the AND circuit A2. The reference signals Ref 1 and Ref 2 are the pulses to have the time width (equivalent to the unit time width of the period of the data signal T) ranging from the rising edge of the clock CK1 to the rising edge of the clock CK2 only when the levels of the consecutive 2 data in the data signal Din changed from high level to low level or vise versa.

The phase comparator latches the data signal Din at the rising edge of the clock signal CK1 in the latch circuit L1. The output of the latch circuit L1 corresponds to the output q1 as is shown in FIG. 4. The latch circuit L1 is designed to latch only the data whose sequential order coincides with even number, so that, where the phase error is not present, the length of the latched data is extended up to the width that is 1.5 times the data period T. Further, the data signal Din is latched at the rising edge of the clock signal CK2 in the latch circuit L2. The output of the latch circuit L2 is q2 as is shown in FIG. 4. The latch circuit L2 is designed to latch only the data whose sequential order coincides with odd number, so that, where the phase error is not present, the length of the latched data is extended up to the width that is 1.5 times the data period T.

The output q1 is latched at the rising edge of the clock CK2 in the latch circuit L3. The output q3 from the latch circuit L3 is used for delaying the data whose sequential order coincides with an even number in the data signal Din by T/2 where the phase error is not present. Similarly, the output q2 is latched at the rising edge of the clock CK1 in the latch circuit L4. The output q4 of the latch circuit L4 is used for delaying the data whose sequential order coincides with an odd number in the data signal Din by T/2 where the phase error is not present.

In the exclusive OR circuit E1, the phase error signal Error 1 is generated as being the exclusive OR of the output q3, as being the nth data of the data signal Din, and the output q2, as being the (n+1)th data (n being an even number) of the data signal Din. Further, in the exclusive OR circuit E2, the phase error signal Error 2 is generated as being the exclusive OR of the output q4, as being the mth data of the data signal Din, and the output q1, as being the (m+1)th data (m being an odd number) of the data signal Din. Since the width of the outputted data of the latch circuit L1 whose sequential order coincides with an even number and the width of outputted data of the latch circuit L2 whose sequential order coincides with an odd number are extended to 1.5* respectively when the phase error is not present, the pulse width of the phase error signal Error 1 and the pulse width of the phase error signal Error 2 are to be extended to 1.5* respectively.

The rising point of the pulse of the phase error signal Error 1 coincides with the transition point (represented by X1 in FIG. 4) of the data signal Din, and the falling point thereof coincides with the rising edge (represented by Y1 in FIG. 4) of the clock signal CK1. The rising point of the pulse of the phase error signal Error 2 coincides with the transition point (represented by X2 in FIG. 4) of the data signal Din, and the falling point thereof coincides with the rising edge (represented by Y2 in FIG. 4) of the clock signal CK2. In other words, the pulse width of the phase error signal Error 1 (phase error signal Error 2) is equivalent to the time period as being the sum of the signal period T and the time period 0.5*T (where the phase error is not present), ranging from the transition point of the data signal Din to the rising edge of the clock signal CK1 (clock signal CK2).

The pulse width of the phase error signal Error 1 and the pulse width of the phase error signal Error 2 increase or decrease respectively by the phase error 0.5*T centering around the pulse width 1.5*T (the pulse width where the phase error is not present) or within the range of 1.5*T±0.5*T. Therefore, the phase error between the data signal Din and each of the clock signals CK1 and CK2 is outputted as the variation of the pulse width of the phase error signal Error 1 and the variation of the pulse width of the phase error signal Error 2. According to the first embodiment, where the phase error between the data signal Din and each of the clock signals CK1 and CK2 is ±Δt, the pulse width of phase error signal can be extended to 1.5*T±Δt from the 0.5*T±Δt in the case of the conventional phase comparator circuit. Thus, the high-speed phase comparator can be composed with the slow-speed elements.

Figure 5A:
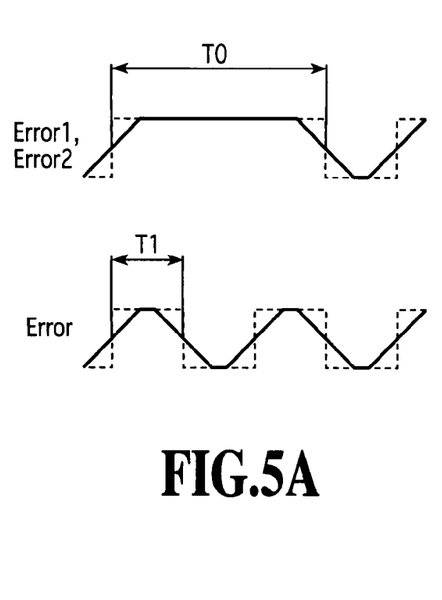

Referring with FIGS. 5A-5C, the pulse width of the phase error signal in the phase comparator circuit according to the first embodiment is compared with the pulse width of the phase error signal in the conventional phase comparator circuit. As seen from FIG. 5A, where the data signal Din and the clock signals CK1 and CK2 are "the in phase state", the pulse width of the phase error signal Error 1 and the pulse width of the phase error signal Error 2 in the phase comparator circuit according to the fist embodiment are T0(=T+T1), whereas the pulse width of the phase error signal Error in the conventional phase comparator circuit is T1.

Figure 5B:
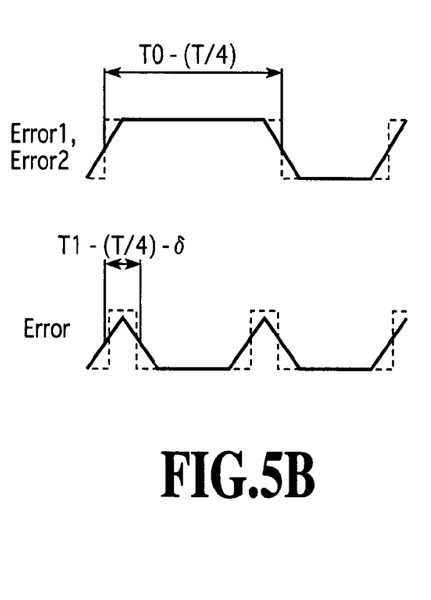

However, as shown in FIG. 5B, when the phase of the clock signal CK1 (CK2) advances, the pulse width decreases by the amounts corresponding to the rise and the fall of the signal (Refer to d in FIG. 5B). Further, when the phase of the data signal Din advances, there is the possibility that phase error signal Error becomes absent and will not be outputted. On the other hand, in the case of the phase comparator circuit according to the first embodiment, for instance, even when the phase error exceeding T/4 has occurred, the phase error signals Error 1 and Error 2 will not become absent, and the phase error can be represented by the pulse width of the phase error signal.

Figure 5C:
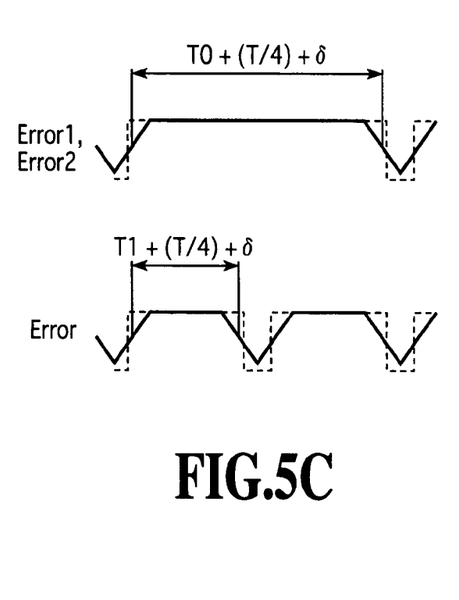

As shown in FIG. 5C, when the phase of the clock signal CK1 (CK2) delays, in any phase comparator circuit, the pulse width increases, and the phase error can be represented as the pulse width of the phase error signal. As discussed in the foregoing, in the case of the phase comparator circuit according to the first embodiment, the pulse width of the phase error signal Error 1 and the pulse width of the phase error signal Error 2 are extended, the error owing to the rising time and the falling time of the signal is less likely to occur. Thus, it is possible to accurately compare the phases with respect to the phase errors in a wide range.

The reference signal Ref 1 is obtained by inputting the output of the exclusive OR circuit E3 and the clock signal CK2 to the AND circuit A1; the output of the exclusive OR E3 is obtained by being connected with the output q3 of the latch circuit L3 and the output q4 of the latch circuit L4. The reference signal Ref 2 is obtained by inputting the output of the exclusive OR circuit E3 and the clock signal CK1 to the AND circuit A2. The reference signal Ref 1 becomes a pulse when the transition of the nth data and the transition of the n+1st data (n represents even number) of the data signal Din have occurred. The reference signal Ref 2 becomes a pulse when transition of the mth data and the transition of the m+1st data (m is an odd number) have occurred.

The pulse of the reference signal Ref 1 and the pulse of the reference signal Ref 2 are the pulses having the data period T regardless of the relationship between the phase of the data signal Din and the phases of the clock signals CK1 and CK2. The reference signal Ref 1 serves as the reference pulse to discriminate the increase or the decrease in the pulse width of the phase error signal Error 1, and the reference signal Ref 2 serves as the reference pulse to determine the increase or the decrease whichever has occurred in the pulse width of the phase error signal Error 2.

According to the first embodiment, the operation edge of the latch circuit is set to the rising edge of the clock, but it can easily be analogized to the substitution of the falling edge of the clock for the rising edge. The sequential order of the data signal represented by the even number or the odd number are set by starting the count of the order from number 0 for convenience, so that the count of the order may be started from number 1. Further, the reference signal is separated into the reference signal Ref 1 and the reference signal Ref 2, but the output of the exclusive OR circuit E3 may be used as the reference signal. Further, the description has been made for the use of the clock signal whose period is 2 times the period of the inputted data signal; however, the phase error may be determined on the basis of the phase error signal whose pulse width is further extended by using the clock signal whose period is a multiple of 2.

Figure 6:
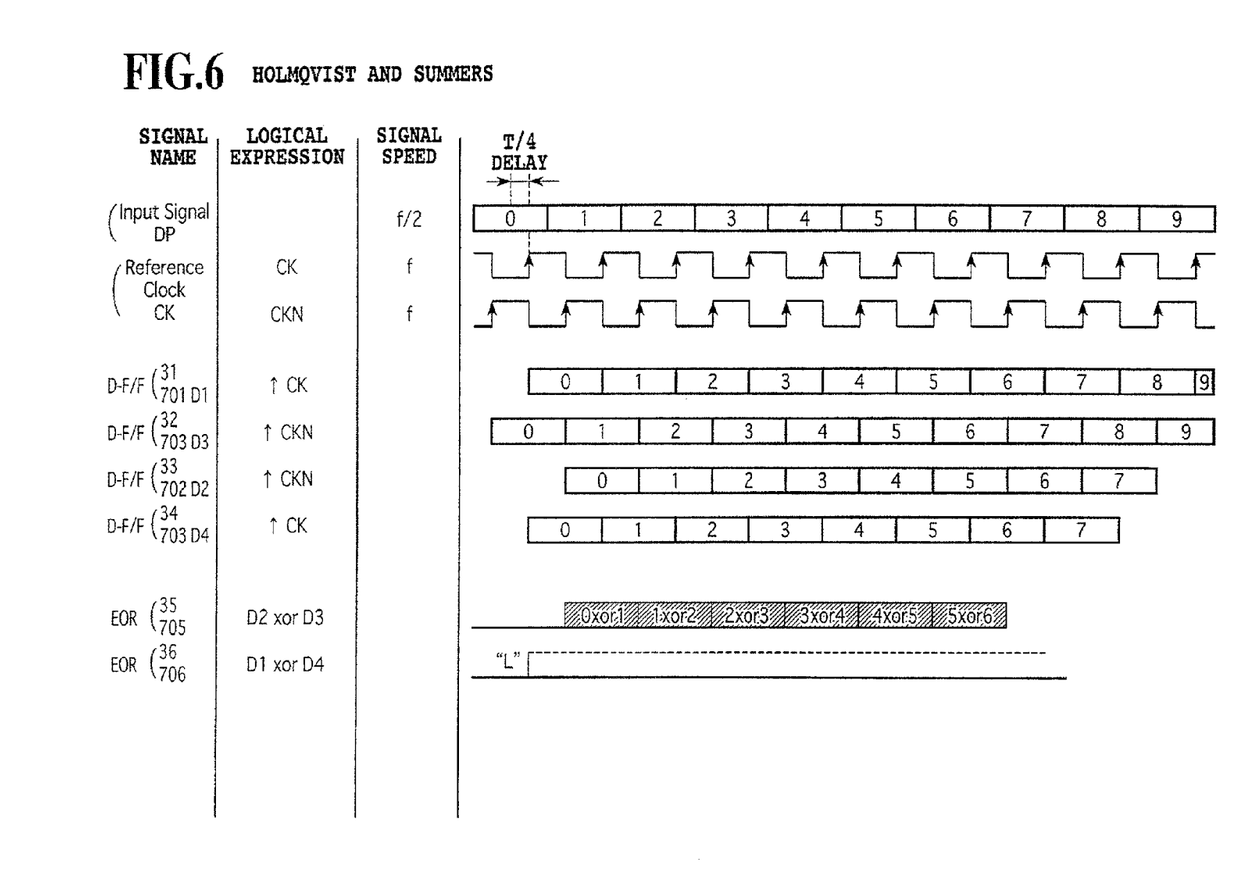
FIG. 6 is the diagram of the phase comparator circuit according to the second embodiment of the present invention.

FIG. 6 shows the phase comparator circuit according to the second embodiment of the present invention. The phase comparator circuit according to the second embodiment differs from the phase comparator circuit according to the first embodiment in being provided with the delay circuit D1 (a first delay circuit) and the delay circuit D2 (a second delay circuit). As for the connection and the operation of the circuit according to the second embodiment, only the differences from those in the case of the first embodiment will be described. The input terminal of the delay circuit D1 is connected with the output terminal of the latch circuit L2, and the output terminal of the delay circuit D1 is connected with the first input terminal of the exclusive OR circuit E1.

The input terminal of the delay circuit D2 is connected with the output terminal of the latch circuit L1, and the output terminal of the delay circuit D2 is connected with the first input terminal of the exclusive OR circuit E2.

The delay circuits D1 and D2 operate to delay the outputs q2 and q1 of the latch circuit L2 and the latch circuit L1 respectively. The amount of the delay is set to about the amount of the delay of the output occurring during the transition of the output q3 and the transition of the output q4 following the transition of the clock signal of the latch circuit L3 or the latch circuit L4. With this setting, the transition timings of the latch circuit L1 (latch circuit L2) and the latch circuit L3 (latch circuit L4) can be made coincide with each other. In this way, the difference in delay of the timing of the input to the exclusive OR circuits E1 and E2 is compensated; the exclusive OR circuits E1 and E2 generate the phase error signal Error 1 and the phase error signal Error 2. The width of the phase error signal Error 1 and the width of the phase error signal Error 2 can be made approximate to the phase difference between the data signal Din and each of the clock signal CK1 and the clock signal CK2, so that the phases can be compared with higher accuracy than in the case of the first embodiment.

(CDR Circuit)

Figure 7:
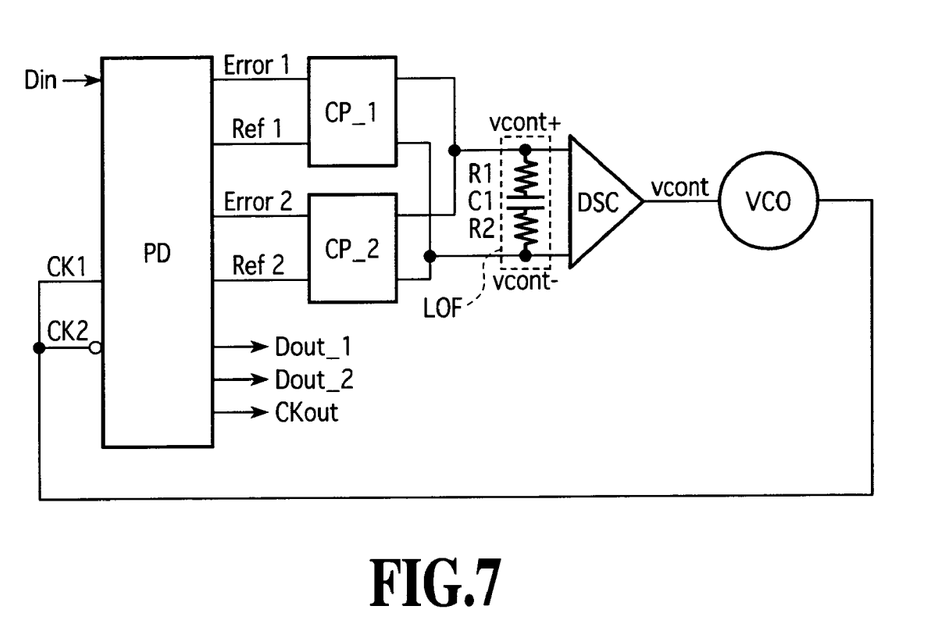
FIG. 7 is the diagram of the CDR circuit according to an embodiment of the present invention.

FIG. 7 shows the CDR circuit according an embodiment of the present invention. The CDR circuit comprises a phase comparator circuit PD, a first charge pump circuit CP_1, a second charge pump circuit CP_2, a loop filter LOF, a double-phase to single-phase voltage transformer circuit DSC and a voltage-controlled oscillation circuit VCO. The phase comparator circuit PD is, for instance, the phase comparator circuit according to the first embodiment as is shown in FIG. 3; the phase comparator circuit PD is designed to output the phase error signal Error 1, representing the phase difference between the transition point of the data signal Din and the rising edge of the clock signal CK1 and also to output the phase error signal Error 2, representing the phase difference between the transition point of the data signal Din and the rising edge of the clock signal CK2. Further, when the transitions of 2 consecutive data in the data signal Din have occurred, the phase comparator circuit PD outputs the reference signal Ref 1, having the time width ranging from the rising edge of the clock signal CK2 to the rising edge of the clock signal CK1, and the reference signal Ref 2, having the time width ranging from the rising edge of the clock signal CK1 to the rising edge of the clock signal CK2.

Further, in FIG. 7, Dout_1 is the output of the data signal corresponding to the clock signal CK1; Dout_2 is the output of the data signal corresponding to the clock signal CK2; and Ckout is the output of the clock signal CK1.

The phase error signal Error 1 and the reference signal Ref 1 are inputted to the first charge pump circuit PC_1, and the phase error signal Error 2 and the reference signal Ref 2 are inputted to the second charge pump circuit PC_2. The charge pump circuits CP_1 and CP_2 make the current flow to the loop filer LOF through a signal line vcont+ and draw the current from the loop filter LOF through the signal line vcont−. Further, while the phase error signal is at a high level, the charge pump circuits CP_1 and CP_2 make the current flow to the loop filter LOF through the signal line Vcont− and draw the current through the signal line vcont+. Further, while the level of the reference signal is high, (the charge pump circuits CP_1 and CP_2) make the current flow to the loop filter LOF through the signal line vcont− and draw the current through the signal line vcont+. while both the phase error signal and the reference signal are at low level, the current will not flow either the signal line vcont+ or the signal line vcont−.

The signal line vcont+ and the signal line vcont− are respectively connected to one end of a resistor R1 and one end of a resistor R2, which constitute the loop filter LOF. In the in phase state, the total amount of the charge flowing to the capacitor C1 of the loop filter LOF during the period wherein the phase error signals are at high levels respectively and the total amount of the charge flowing out of the capacitor C1 during the period wherein the reference signals are at high levels are in equilibrium to keep the potential difference between the signal line vcont+ and the signal line vcont− is kept constant.

Here, the current flowing into the loop filter LOF during the period through which the phase error signal is at high level is defined as the source current, whereas the current flowing into the loop filter LOF during the period through which the reference signal is at high level is defined as the sink current. The current ratio between the source current and the sink current in each of the first charge pump circuit CP_1 and the second charge pump circuit CP_2 is set to the reciprocal of the ratio between the pulse width of the phase error signal and the pulse width of the reference signal so that the amount of the charge flowing into and the amount of the charge flowing out of the capacitor CI is kept in equilibrium with the in phase state. In other words, the ratio between the source current and the sink current is set to 2:3.

On the other hand, when the phase of the rising edge of the clock signal CK1 is delayed to the center of the transition point of the data signal Din, the high-level duration of the phase error signal increases while the potential difference between the signal line vcont+ and the signal line vcont− increase towards the plus side. When the phase of the rising edge of the clock signal CK1 advances to the center of the transition point of the data signal Din, the high-level duration of the phase error signal decreases while the potential difference between the signal line vcont+ and the signal line vcont− increase towards minus side. The signal lines, vcont+ and vcont− are connected with the double-phase to single-phase voltage transformer circuit DSC.

The double-phase to single-phase voltage transformer circuit transforms the potential difference between the signal line vcont+ and the signal line vcont− to the output voltage level of the signal line vcont. When the potential difference between the signal line vcont+ and the signal line vcont− increases towards the plus side, the potential of the signal line vcont on the output side rises, whereas when the potential difference between the signal line vcont+ and the signal line vcont− increases towards the minus side, the potential of the signal line vcont on the output side will fall. In the in phase state, the value of the signal line vcont becomes constant. The signal line vcont is connected with the voltage-controlled oscillation circuit VCO.

The voltage-controlled oscillation circuit VCO oscillates at a frequency near the frequency of f/2 (=1/(2*T)) to the data frequency T to output the clock signal CK1. When the voltage of the signal line vcont outputted from the double-phase to single-phase voltage transformer circuit rises, the frequency rises, whereas when the voltage of the signal line vcont falls, the frequency falls. With this system, the rising edge of the clock signal CK1 can be adjusted to coincide with the center of the transition point of the data signal Din, whereby the phase of the clock signal and the phase of the data signal are synchronized to regenerate the data signal.

Figure 8:
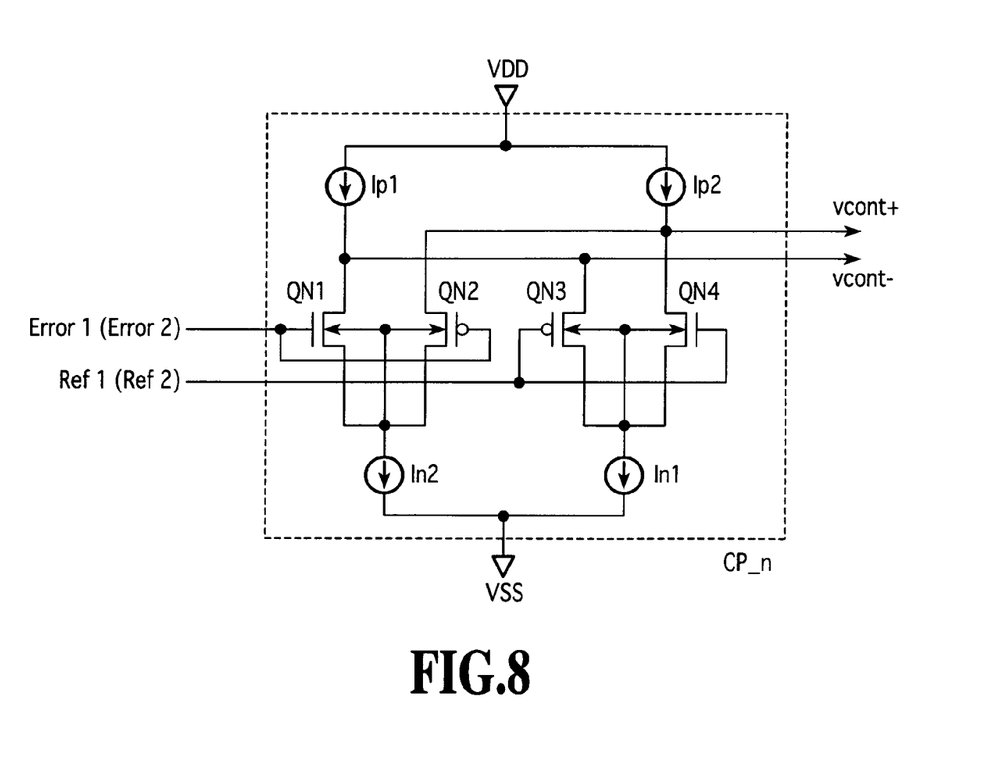
FIG. 8 is the diagram of the charge pump circuit according to the first embodiment of the present invention.

FIG. 8 shows the charge pump circuit according to the first embodiment of the present invention. Since both the first charge pump circuit CP_1 and the second charge pump circuit CP_2 are incorporated into the CDR circuit, the two circuits are denoted as the charge pump circuit CP_n in this figure. The charge pump circuit CP_n comprises the four power sources, namely Ip1, Ip2, In1 and In2, and the NMOS transistors, namely QN1, QN2, QN3 and QN4. The phase error signal Error 1, as being an input to the charge pump circuit CP_n, is applied to the gate electrode of the transistor QN1, and the inverted signal of the phase error signal Error 1 (phase error signal Error 2) is applied to the gate electrode of the transistor QN2. Further, the reference signal Ref 1 (reference signal Ref 2) is applied to the gate electrode of the transistor QN3, and the inverted signal of the reference signal Ref 1 (reference signal Ref 2) is applied to the gate electrode of the transistor QN4.

The source electrodes of the transistors QN1 and QN2 are connected to the side of the power source VDD of a common current source In2, and the source electrodes of the transistors QN3 and QN4 are connected to the side of the power source VDD of the common current source In1. The drain electrodes of the transistors QN1 and QN3 are connected to the side of the power source VSS of the current source Ip1 and also connected with the output signal line vcont+. The drain electrodes of the transistors QN2 and QN4 are connected on the side of the power source VSS of the common current source Ip2 and also with the output signal line vcont+.

In the in phase state, the ratio between the pulse width of each of the phase error signals Error 1 and Error 2 and the pulse width of each of the reference signals Ref 1 and Ref 2 is 3:2 as shown in FIG. 4. In the charge pump circuit CP_n, the current value of the current source Ip1 and the current value of the current source In1 are set to equal value Io, and the current values of the current sources Ip2 and In2 are equally set to $(2/3)*I$. During the period through which the phase error signals Error 1 and Error 2 are at high level respectively, the value of the source current becomes $(2/3)*Io$, and, during the period through which the values of the reference signals Ref 1 and Ref 2 are at high level respectively, the value of the sink current becomes Io. The source charge amount $T*Io$, as being the product of the pulse width $(3/2)*T$ of each of the phase error signals Error 1 and Error 2 multiplied by the source current $(2/3)*Io$, can be equalized with the source charge amount $T*Io$, as being the product of the pulse width T of each of the reference signals Ref 1 and Ref 2 multiplied by the sink current Io. In this way, the amount of the charge flowing into and flowing out from the capacitor C1 can be balanced with each other.

Figure 9:
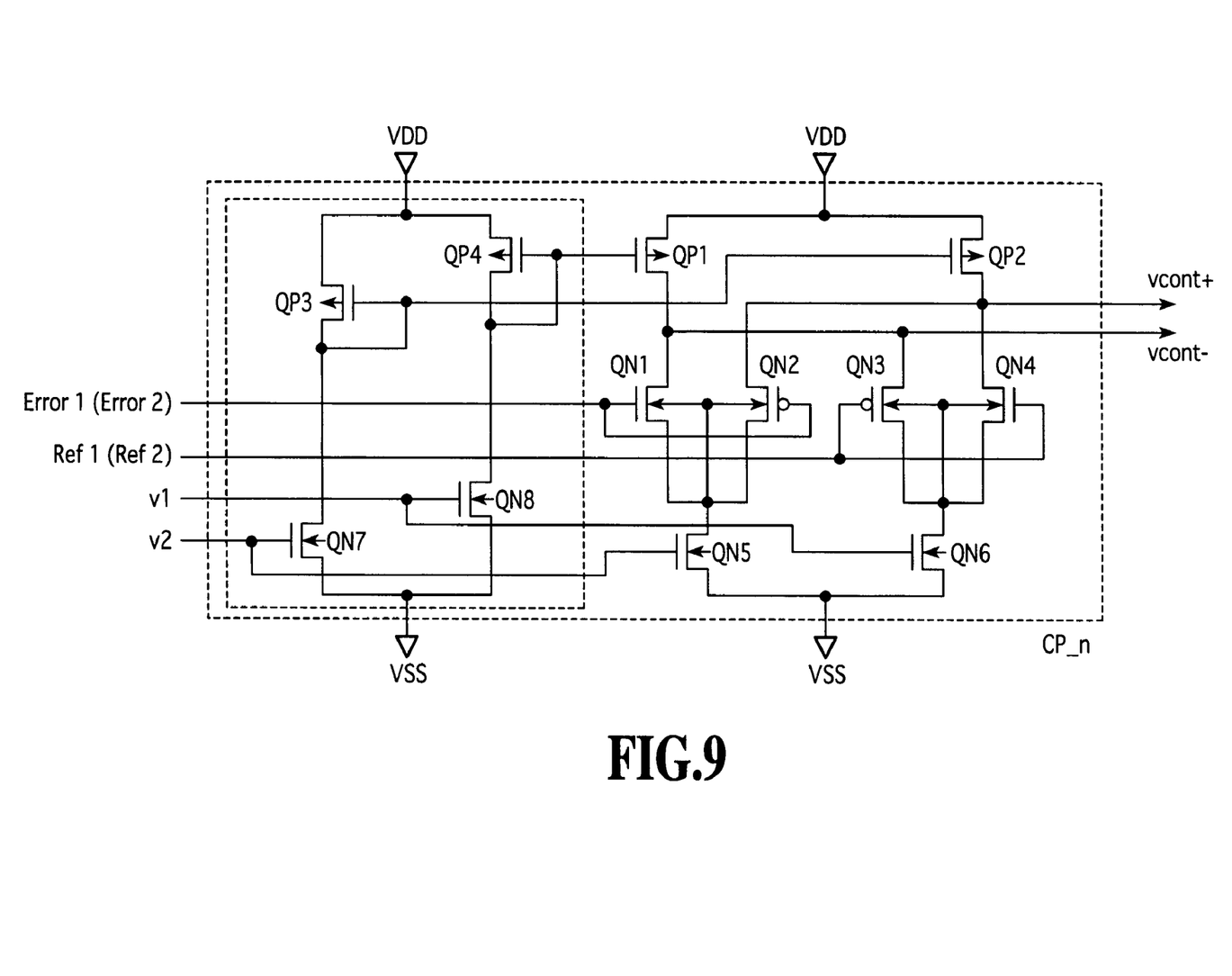
FIG. 9 is the diagram of the charge pump circuit according to the second embodiment of the present invention.

FIG. 9 shows the charge pump circuit according to the second embodiment of the present invention. The charge pump circuit CP_n is composed by replacing the components of the charge pump CP_n according to the first embodiment shown in FIG. 8; more specifically the current source Ip1 is replaced with PMOS transistor QP1; the current source In1 is replaced with NMOS transistor QN6, and the source current source In2 is replaced with the NMOS transistor QN5. The transistors QP1 and QN6 are controlled on the basis of the controlling input voltage v1 by using the current mirror circuit, comprising transistor QP4 and QN8 and are made to flow the common current Io. The transistors QP2 and QN5 are controlled on the basis of the controlling input voltage v2 by using the current mirror circuit, comprising transistors QP3 and QN7, and made to flow of common current k*Io.

The controlling voltages v1 and v2 can be set to any voltages by using external means. In this way, the current ratio k between the source current and the sink current in the charge pump circuit CP_n can be set freely. Thus, in the in phase state, the pulse width ratio between each of the phase error signals Error 1 and Error 2 and each of the reference signals Ref 1 and Ref 2 can be varied to (1/k) by means of the external voltages v1 and v2. In other words, when the phase error is zero, the phase relationship between the data signal Din and the clock signal CK1 can be adjusted. In this way, as shown in FIG. 4, the pulse widths of the phase error signals Error 1 and Error 2, as being the outputs of the phase comparator circuit, can be adjusted, for instance, from 1.5*T to 1.3*T or the like. Even when the phase of the clock signal CK1 (CK2) is delayed, the phases can be compared with high accuracy within a greater range.

Further, the double-phase to single-phase voltage transformer circuit DSC can be composed of the addition circuit using the ordinary operational amplifier, while the voltage-controlled oscillator circuit may comprise an ordinary LC oscillator circuit and a ring oscillator circuit. Further, the loop filter LOF may comprise the single-phase charge pump, the single-phase filter and the voltage follower circuit without using the above-mentioned double-phase loop filter.

The invention claimed is:

1. A phase comparator circuit for operating with a clock signal whose period is 2 times the unit time width of an inputted data signal, said phase comparator circuit characterized in that;

said data signal is inputted to a first latch circuit and a second latch circuit, said first latch circuit performs the latching operation thereof with a first clock signal, and said second latching circuit performs the latching operation thereof with the second clock signal, as being an inverted clock signal of said first clock signal;

the output of said first latching circuit is inputted to a third latch circuit, the output of said second latch circuit is inputted to a fourth latch circuit, said third latch circuit performs the latching operation thereof with said second clock signal, and said fourth latch circuit performs the latching operation thereof with said first clock signal;

the output of said second latch circuit is connected to a first delay circuit, an exclusive OR of the output from the first delay circuit and the output from said third latch circuit is used as a first phase error signal; and the output of said first latch circuit is connected to a second delay circuit, an exclusive OR of the output from said second delay circuit and the output from said fourth latch circuit is used as a second phase error signal.

2. A CDR circuit including a phase comparator circuit, a charge pump circuit and a loop filter, operating with a clock signal whose period is 2 times the unit time width of an inputted data signal, and said phase comparator circuit characterized in that;

said data signal is inputted to a first latch circuit and a second latch circuit, said first latch circuit performs the latching operation thereof with a first clock signal, and said second latching circuit performs the latching operation thereof with the second clock signal, as being an inverted clock signal of said first clock signal;

the output of said first latching circuit is inputted to a third latch circuit, the output of said second latch circuit is inputted to a fourth latch circuit, said third latch circuit performs the latching operation thereof with said second clock signal, and said fourth latch circuit performs the latching operation thereof with said first clock signal;

the output of said second latch circuit is connected to a first delay circuit, an exclusive OR of the output from the first delay circuit and the output from said third latch circuit is used as first phase error signal;

the output of said first latch circuit is connected to a second delay circuit, an exclusive OR of the output from said second delay circuit and the output from said fourth latch circuit is used as a second phase error signal; and said first and second phase error signals are outputted to said charge pump circuit.

* * * * *